(12) United States Patent
Weber

(10) Patent No.: US 6,287,528 B1
(45) Date of Patent: Sep. 11, 2001

(54) METHOD FOR REMOVING DUST

(75) Inventor: Martin Weber, Kastl (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/425,693

(22) Filed: Oct. 22, 1999

(30) Foreign Application Priority Data

Nov. 24, 1998 (DE) .............................................. 198 54 235

(51) Int. Cl.⁷ .................................................... B01D 53/34
(52) U.S. Cl. ................... 423/215.5; 423/DIG. 5; 423/DIG. 6; 588/231
(58) Field of Search .................. 423/210, 215.5, 423/DIG. 5, DIG. 6; 588/231

(56) References Cited

U.S. PATENT DOCUMENTS

| | | | |
|---|---|---|---|
| 3,914,088 | 10/1975 | Huyck | 431/5 |
| 4,959,085 | 9/1990 | Van Camp et al. | 55/72 |
| 5,131,974 | * 7/1992 | Oda et al. | 156/601 |
| 5,458,862 | 10/1995 | Glawion | 423/245.3 |
| 5,800,792 | 9/1998 | Ibaraki et al. | 423/210 |
| 5,900,058 | * 5/1999 | Mizuishi et al. | 117/208 |

FOREIGN PATENT DOCUMENTS

| | | |
|---|---|---|
| 3318796A1 | 11/1984 | (DE) . |
| 4208151A1 | 9/1993 | (DE) . |
| 0347753A1 | 12/1989 | (EP) . |
| 63-303886 A | * 12/1988 | (JP) . |
| 3-137916 A | * 6/1991 | (JP) ................................... 423/215.5 |

OTHER PUBLICATIONS

English Derwent Abstract AN1984–301162 [49] corresp to DE 33 18 796.
English Derwent Abstract AN 1990–001140 [01] corresp to EP 0 347 753.
Chem. Abstr. 131 (1999) 265115.

* cited by examiner

Primary Examiner—Steven P. Griffin
Assistant Examiner—Timothy C Vanoy
(74) Attorney, Agent, or Firm—Collard & Roe, P.C.

(57) ABSTRACT

A method for removing combustible, metallurgical dust out of the exhaust gas from installations for drawing single silicon crystals is provided. The dust contaminated exhaust gas and a reactive gas, such as air, oxygen or ozone, are fed into a reactor operated at a temperature of 50 to 500° C. where the reactive gas combusts the dust to form solid products. The reactor may be equipped with a catalyst, such as nickel, palladium or platinum, to promote the reaction. The solid products-containing exhaust gas is passed through a filter. By combusting the dust in the reactor, spontaneous explosions can be minimized.

7 Claims, 1 Drawing Sheet

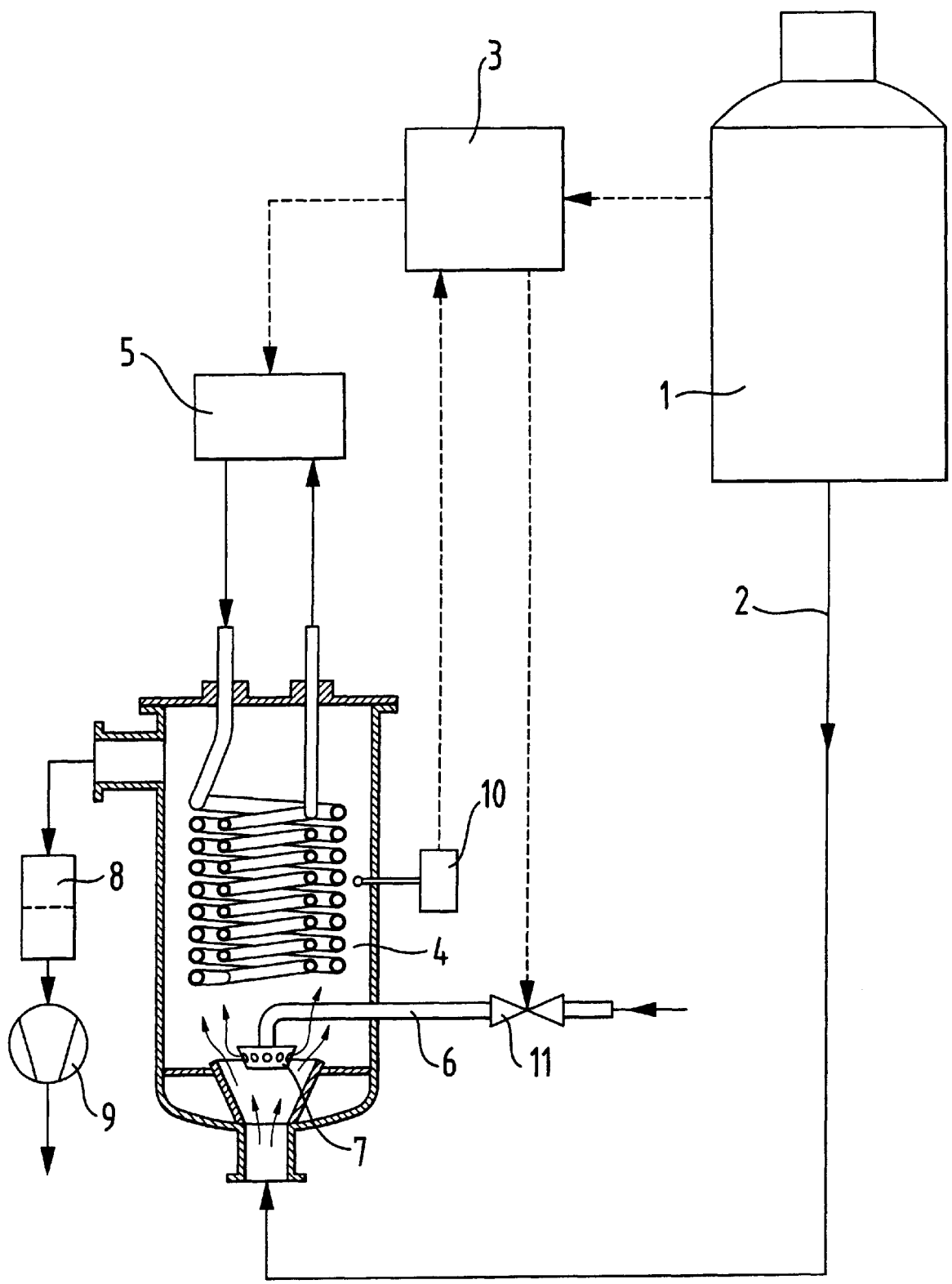

METHOD FOR REMOVING DUST

BACKGROUND OF THE INVENTION

1. Field of the Invention

The invention relates to a method for passivating combustible, metallurgical dust which accumulates in the off-gas filter of crucible-drawing installations, in particular of crucible-drawing installations for drawing single silicon crystals. The invention also relates to an oxidation device for carrying out the method.

2. The Prior Art

The Czochralski crucible-drawing method is known for the production of high-purity single crystal rods. During the crucible-drawing of crystal rods, in particular of silicon rods using the Czochralski method, the monocrystalline or polycrystalline silicon fragments which are intended to produce the molten silicon are generally placed in a melting crucible, preferably in a quartz crucible. The silicon fragments are heated by means of a heat source, and then a monocrystalline seed is immersed in the molten liquid and drawn upward while being rotated, with the result that a crystal rod grows at the bottom end of the monocrystalline seed.

In order to establish the type of conductivity and the resistance of the crystal which is grown, dopants, such as boron, phosphorus, arsenic and antimony are added to the silicon fragments or the molten material. In addition to the silicon fragments and the dopants, the molten material also contains oxygen. The oxygen is introduced into the molten material from the surface of the quartz crucible by the contact between them. The oxygen is moved within the crucible by the forced convection of the molten material resulting from the rotation of the crucible and the heat convection of the molten material resulting from temperature differences therein.

During this movement, some of the oxygen is evaporated from the surface of the molten material in the form of the oxides of the constituents of the molten material. Depending on the particular dopant, these oxides, in addition to SiO, also include, owing to their high vapor pressure, the oxygen compounds of arsenic and antimony, in particular arsenic trioxide and antimony trioxide. Since an inert gas, preferably argon, generally flows continuously through the crucible-drawing installation, the oxides of the constituents of the molten material have different oxidation numbers in the gas phase and in the off-gas flow from the installation.

Finely divided metal oxide/semimetal oxide mixtures of medium oxidation numbers are highly reactive industrial dust materials with spontaneous combustion ignition temperatures of below 100° C. These dust materials tend, in particular in the downstream off-gas filters, to burn the filters or to cause dust explosions.

SUMMARY OF THE INVENTION

It is an object of the present invention to increase the spontaneous combustion ignition temperatures of combustible, metallurgical dust which accumulates in the off-gas filter of crucible-drawing installations.

This object is achieved according to the present invention by providing a method for passivating combustible, metallurgical dust which accumulates in the off-gas filter of crucible-drawing installations, wherein the dust in the off-gas flow from the crucible-drawing installation is passivated continuously by means of a reaction gas at temperatures of from 50° C. to 500° C.

In the context of the invention, passivating is understood to mean the controlled oxidation of small amounts of dust in the gaseous phase. Reaction gas is understood to mean gasses or gas mixtures which have an oxidizing action.

The object is also achieved according to the present invention by providing an oxidation device for passivating combustible, metallurgical dust which accumulates in the off-gas filter of crucible-drawing installations, which device has a reaction chamber with a heater device, at least one reaction-gas inlet and a control unit which controls the temperature in the reaction chamber and the supply of reaction gas to the reaction chamber as a function of the drawing conditions.

Surprisingly, it was found that by an accurately metered addition of a reaction gas to the off-gas flow from a crucible-drawing installation at a temperature of from 50° C. to 500° C., preferably from 100° C. to 300° C., the gaseous dust is passivated without interfering with the drawing process.

The reaction gas used is preferably air, oxygen, ozone or mixtures of these gases, with air being a particularly preferred reaction gas.

The delivery of gas within the reaction chamber ensures, for example by means of a suitably long residence time, that the temperature prevailing in the reaction chamber is transferred to the gas mixture, comprising the reaction gas and the off-gas flow. The supply of reaction gas and the temperature in the reaction chamber are controlled by means of a control unit. The off-gas flow which flows into the reaction chamber is mixed with the reaction gas by means of a mixing device.

The supply of the reaction gas, the temperature in the reaction chamber and, if appropriate, the use of a catalyst are dependent on the conditions of the dust materials. The morphology and the composition of the dust materials differ depending on the crucible-drawing process, and on the amount of dust, which increases with increasing initial charge of silicon used, process duration and temperature.

The continuous passivation of only small amounts of gaseous dust in the oxidation device according to the invention during the drawing process using small amounts of reaction gas has various advantages. In particular, it results in homogenous passivation of the dust, i.e. there is no formation of particles or clusters which lead to spontaneously igniting smoldering fires or deflagrations. The passivation of in each case only small amounts of dust has the advantage that the reaction-gas partial pressure in the gas chamber of the crucible-drawing installation increases only slightly. Hence, the vacuum conditions required for the crucible-drawing process are therefore not impaired.

The performance of the method and of the oxidation device according to the invention for carrying out the method is made clear by Experiments 2 and 3:

|  | T[20 C.] | Air [1/h] | $T_{sz}$ [° C.] | $T_z$ [° C.] |
| --- | --- | --- | --- | --- |
| Experiment 1 | — | — | 155 | 260 |
| Experiment 2 | 230 | 200 | 220 | 290 |
| Experiment 3 | 230 | 500 | 220 | 330 |

In the experiments, in each case one crystal rod was drawn in a crucible-drawing installation according to the prior art. Exactly identical drawing conditions prevailed, such as for example the flow of inert gas, the melting temperature, the initial charge of silicon, the type of dopant and the amount of dopant in the crucible-drawing installation. In Experiments 2 and 3, the claimed oxidation device was positioned in the off-gas flow from the crucible-drawing installation, between the crucible-drawing installation and the off-gas filter. The reaction chamber of the oxidation device was heated to a temperature T[° C.] of 230° C. by means of a heater device. The off-gas flow which flows through the reaction chamber was mixed with air, which contains approximately 21% by volume of pure oxygen, by means of a mixing device. In Experiment 2, the off-gas flow was mixed with 200 l of air per hour (air[l/h]), and in Experiment 3 with 500 l of air per hour (air [l/h]).

After drawing of the crystal rods, the dust which had accumulated in the off-gas filter was examined. By means of the oxidation device, it was possible to increase the spontaneous combustion ignition temperature $T_{SZ}$[° C.] of the dust from 155° C. (Experiment 1) to 220° C. (Experiments 2 and 3). At the same time, the ignition temperature $T_Z$[° C.] of the dust rose from 260° C. in Experiment 1 to 290° C. in Experiment 2 or to 330° C. in Experiment 3.

BRIEF DESCRIPTION OF THE DRAWINGS

Other objects and features of the present invention will become apparent from the following detailed description considered in connection with the accompanying drawing which discloses embodiments of the present invention. It should be understood, however, that the drawing is designed for the purpose of illustration only and not as a definition of the limits of the invention.

In the drawing, the one FIGURE shows a vertical section through a preferred embodiment of the oxidation device according to the invention, and also, in diagrammatic form, through a crucible-drawing installation, a control unit, an off-gas filter and a vacuum pump. The FIGURE also shows the preferred arrangement of the oxidation unit in the off-gas flow from a crucible-drawing installation.

DETAILED DESCRIPTION OF PREFERRED EMBODIMENTS

The reference numeral 1 diagrammatically denotes a crucible-drawing installation according to the prior art, with an off-gas discharge line 2. A control unit 3 controls the temperature in the reaction chamber temperature sensor 10 and the supply of reaction gas to the reaction chamber regulating valve 11 of the oxidation device 4 as a function of the drawing conditions. The conditions include for example the flow of inert gas, the melting temperature, the initial charge of silicon and the type of dopant and the amount of dopants.

The reaction chamber of the oxidation device 4 has a heater device 5 which heats a gas mixture comprising reaction gas and off-gas flow, for example by thermal radiation, convection or thermal conduction.

Moreover, the reaction chamber 4 has at least one reaction-gas inlet 6. At least one mixing device 7, for example in the form of a nozzle or a gas-guiding surface, is fitted in order to mix the off-gas flow with the reaction gas. The reaction gas is supplied, for example, via an aperture diaphragm or a flow-controlling device. The reaction gas, in particular oxygen, may emanate, for example, from zirconium oxide materials which are located in the reaction chamber 4. The reaction rate can be increased by heterogeneous catalysis. Preferred catalysts are precious metals, as well as nickel, with palladium and platinum being particularly preferred.

The off-gas flow from the crucible-drawing installation flows through a gas feed line into the reaction chamber of the oxidation device 4. In order to prevent diffusion of the reaction gas or the gas mixture comprising reaction gas and off-gas from the reaction chamber 4 towards the crucible-drawing installation, counter to the flow of off-gas, ideally shaped screens are arranged over the gas feed line. After passivation of the combustible, metallurgical dust, the off-gas flow is guided out of the reaction chamber 4, via a gas discharge line and an off-gas filter or dust filter 8, to a vacuum pump 9.

The invention reduces the risk of fire and explosion for combustible, metallurgical dust and thus makes this dust safer to handle and store.

Accordingly, while a few embodiments of the present invention have been shown and described, it is to be understood that many changes and modifications may be made thereunto without departing from the spirit and scope of the invention as defined in the appended claims.

What is claimed is:

1. A method for passivating combustible, metallurgical dust in an off-gas from a crucible, crystal-drawing installation comprising flowing the off-gas containing the combustible metallurgical dust from said crucible, crystal-drawing installation to a reaction chamber;

mixing the off-gas flow containing the combustible metallurgical dust with a reaction gas by means of a mixing device;

passivating the dust continuously by reacting with said reaction gas at a temperature of from 50° C. to 500° C. in said reaction chamber; and flowing the off-gas containing the passivated dust from said reaction chamber through an off-gas filter in order to accumulate the passivated dust in the off-gas filter.

2. The method as claimed in claim 1, comprising providing a control unit; and controlling a supply of said reaction gas and controlling the temperature in said reaction chamber by means of said control unit.

3. The method as claimed in claim 1, wherein the reacting further comprises using heterogeneous catalysis which includes a precious metal catalyst for promoting the dust passivation.

4. The method as claimed in claim 3, wherein the precious metal catalyst is selected from the group consisting of palladium and platinum.

5. The method as claimed in claim 4, wherein the precious metal catalyst is palladium.

6. The method as claimed in claim 4, wherein the precious metal catalyst is platinum.

7. The method as claimed in claim 1, wherein the reacting further comprises using heterogeneous catalysis which includes a nickel catalyst for promoting the dust passivation.

\* \* \* \* \*